(12) United States Patent
Feiweier et al.

(10) Patent No.: US 7,573,266 B2
(45) Date of Patent: Aug. 11, 2009

(54) METHOD AND MAGNETIC RESONANCE SYSTEM FOR ADJUSTMENT OF THE FIELD STRENGTH OF RF PULSES

(75) Inventors: Thorsten Feiweier, Poxdorf (DE); Peter Heubes, Poxdorf (DE); Thorsten Speckner, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 169 days.

(21) Appl. No.: 11/612,802

(22) Filed: Dec. 19, 2006

(65) Prior Publication Data

US 2007/0145975 A1 Jun. 28, 2007

(30) Foreign Application Priority Data

Dec. 22, 2005 (DE) .................... 10 2005 061 567

(51) Int. Cl.
*G01V 3/00* (2006.01)
(52) U.S. Cl. ...................... 324/307; 324/313
(58) Field of Classification Search .......... 324/307, 324/313

See application file for complete search history.

(56) References Cited

U.S. PATENT DOCUMENTS 5,416,412 A * 5/1995 Slayman et al. ............ 324/314

| 6,230,039 B1 | 5/2001 | Stuber et al. |
| 2005/0073304 A1 | 4/2005 | Feiweier et al. |
| 2005/0083054 A1 | 4/2005 | Feiweier et al. |

FOREIGN PATENT DOCUMENTS

WO  WO 2005/043182  5/2005

* cited by examiner

*Primary Examiner*—Brij B. Shrivastav
*Assistant Examiner*—Megann E Vaughn
(74) *Attorney, Agent, or Firm*—Schiff Hardin LLP

(57) ABSTRACT

In a method for adjustment of the field strength of radio-frequency pulses as well as a magnetic resonance measurement system, radio-frequency pulses are emitted by a radio-frequency antenna of a magnetic resonance measurement system in a magnetic resonance measurement. A test volume slice is initially excited by emission of radio-frequency pulses with a defined pulse amplitude by the appertaining radio-frequency antenna and one-dimensional, spatially-resolved characteristic values are determined along an extent direction of the test volume slice. The one-dimensional, spatially-resolved characteristic values respectively represent a local field strength of the $B_1$ field in strips of the test volume slice running perpendicular to the extent direction. An average value of the determined characteristic values is then formed over at least one determined segment along the extent direction of the test volume slice. A pulse amplitude of the radio-frequency pulses that is to be set for the magnetic resonance measurement to be implemented is determined on the basis of the average value.

15 Claims, 6 Drawing Sheets

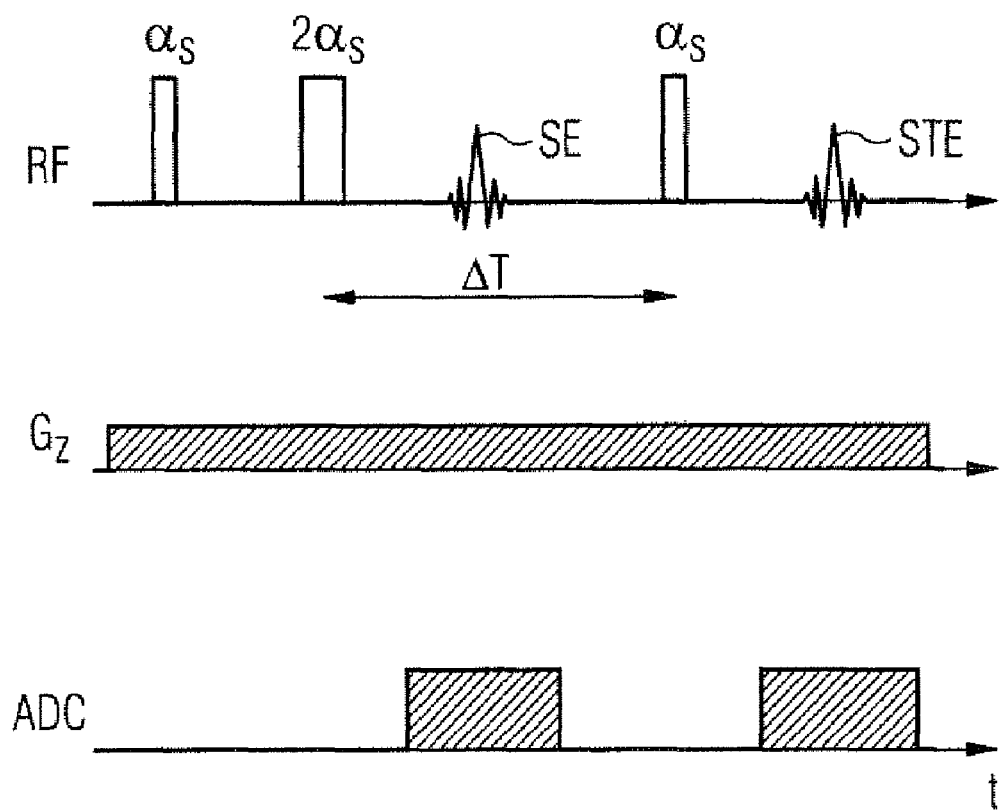

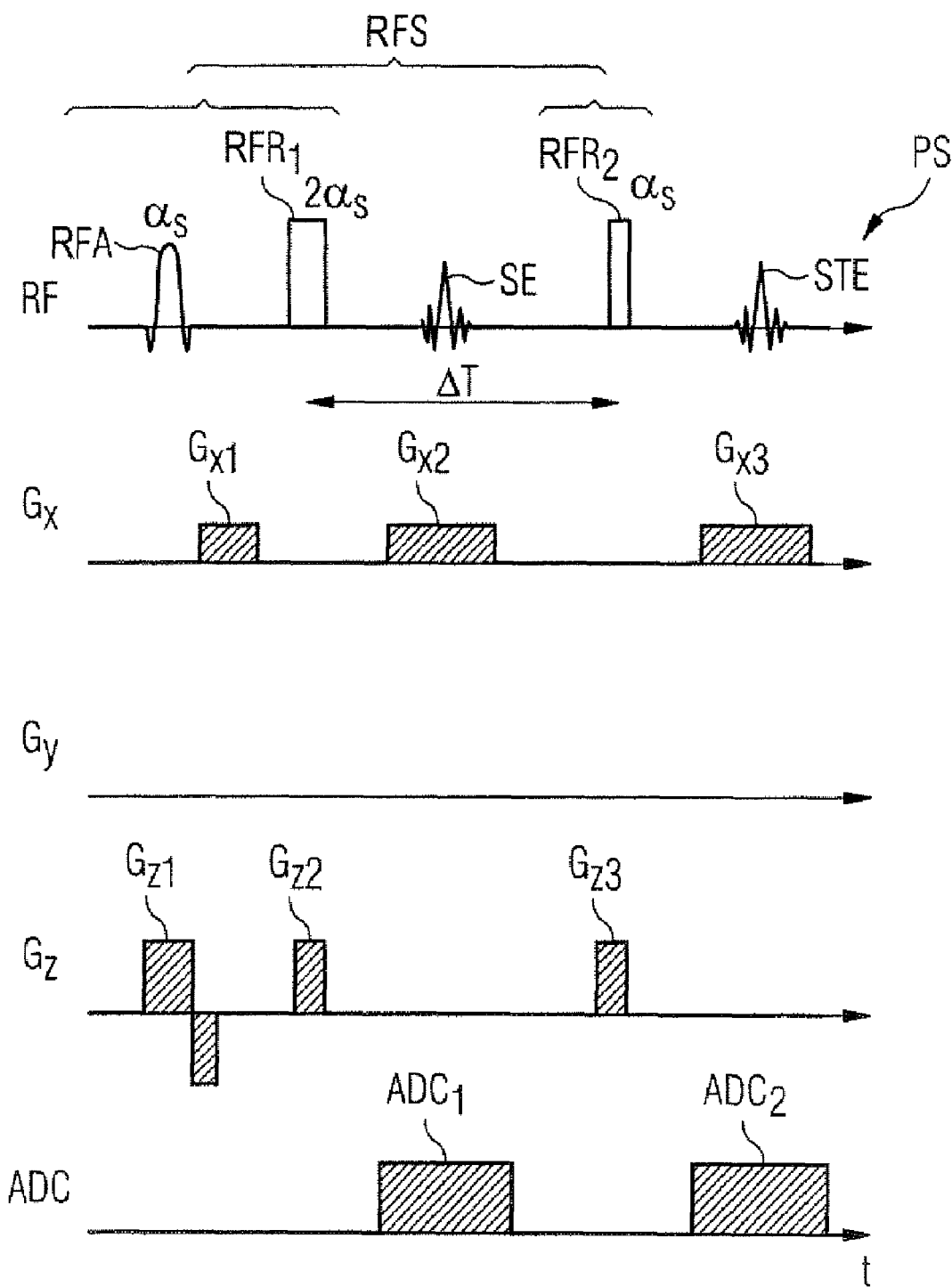

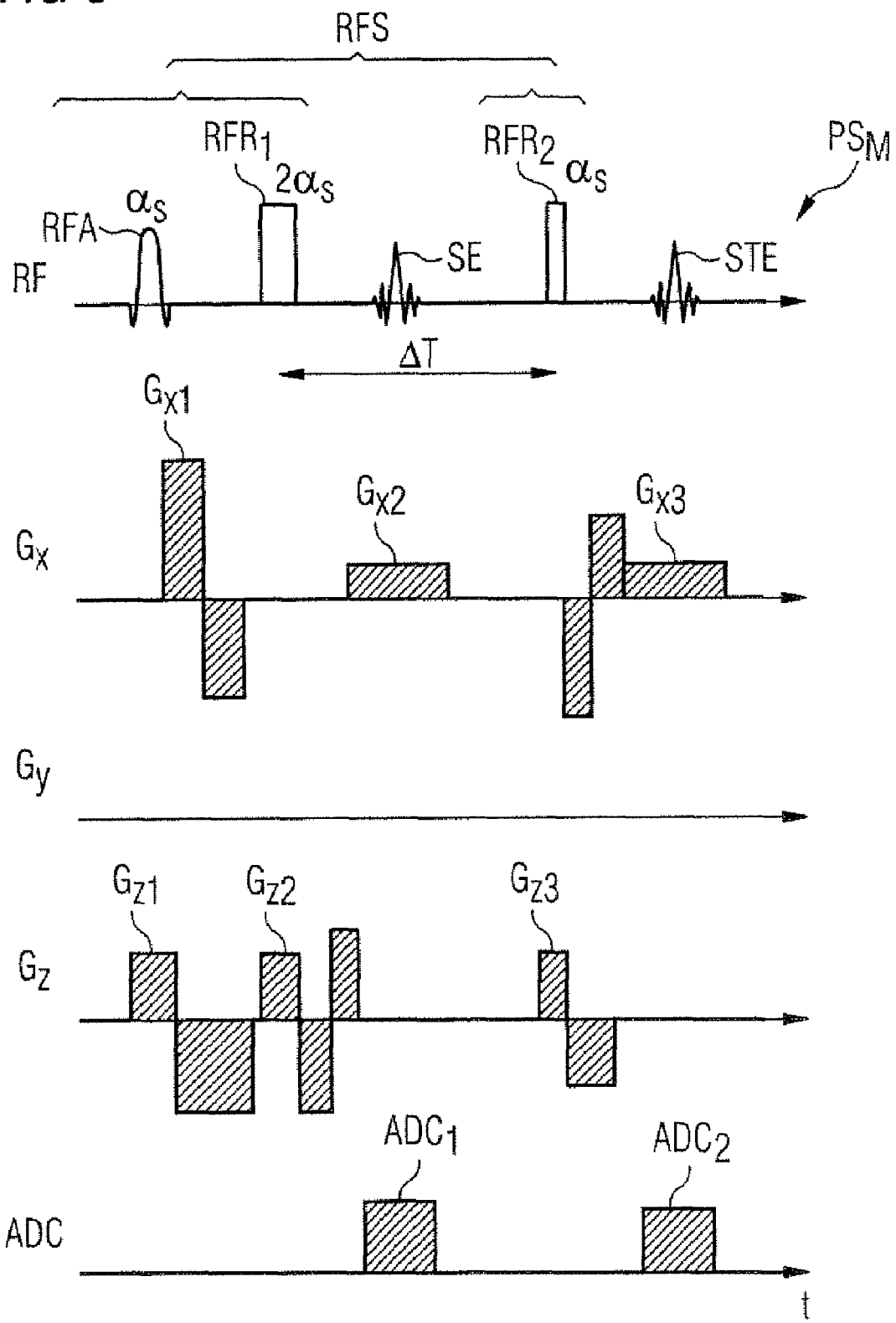

METHOD AND MAGNETIC RESONANCE SYSTEM FOR ADJUSTMENT OF THE FIELD STRENGTH OF RF PULSES

BACKGROUND OF THE INVENTION

1. Field of the Invention

The invention concerns a method for adjustment of radio-frequency pulses which are emitted by a radio-frequency antenna of a magnetic resonance measurement system in a magnetic resonance measurement. Moreover, the invention concerns a magnetic resonance measurement system with a radio-frequency antenna and with a corresponding adjustment device for adjustment of the field strength of radio-frequency pulses that are emitted by the radio-frequency antenna in a magnetic resonance measurement.

2. Description of the Prior Art

Magnetic resonance tomography has become a widespread technique for acquisition of images of the inside of the body of a living examination subject. In order to acquire an image with this method, i.e. to generate a magnetic resonance exposure of an examination subject, the body or the body part of the patient to be examined must initially be exposed to an optimally homogenous static basic magnetic field (generally designated as a $B_0$ field), which is generated by a basic field magnet of the magnetic resonance measurement device. During the acquisition of the magnetic resonance images, rapidly switched gradient fields that are generated by gradient coils are superimposed on this basic magnetic field for spatial coding. With one or more radio-frequency antennas, radio-frequency pulses of a defined field strength are radiated into the examination subject. The magnetic flux density of these radio-frequency pulses is typically designated $B_1$. The pulse-shaped radio-frequency field is therefore generally called a $B_1$ field for short. By means of these radio-frequency pulses the nuclear spins of the atoms in the examination subject are excited such that they are moved from their state of equilibrium by an "excitation flip angle" (also called "flip angle" for short in the following) parallel to the basic magnetic field $B_0$. The nuclear spins then precess in the direction of the basic magnetic field $B_0$. The magnetic resonance signals thereby generated are acquired by radio-frequency receiving antennas. The receiving antennas can be either the same antennas with which the radio-frequency pulses are also radiated or separate receiving antennas. The magnetic resonance images of the examination subject are ultimately created based on the received magnetic resonance signals. Every image point in the magnetic resonance image is thereby associated with a small body volume, known as a "voxel", and every brightness or intensity value of the image points is linked with the signal amplitude of the magnetic resonance signal acquired from this voxel.

Before the actual MR imaging, patient-specific adjustments must be implemented in order to determine the system variables dependent on the measurement subject. Adjustment of the field strength of the radio-frequency pulses (i.e. of the RF pulse amplitudes) is one of these patient-specific adjustment. The fact is taken into account that the transmission antenna is attenuated dependent on the examination subject and the pulse amplitudes of the RF power amplifier that are necessary to achieve the desired B1 fields or flip angles in the examination subject consequently vary dependent on the subject. Given a homogeneous flip angle distribution within the subject, a clear relation exists between pulse amplitude of the radio-frequency pulse and the amplitude of the of the $B_1$ field (and therewith also the achieved flip angle α) according to the equation $$\alpha = \int_{t=0}^{\tau} \gamma \cdot B_1(t) \cdot dt, \quad (1)$$

which generally follows a linear function. γ is the gyromagnetic ratio which can be considered as a fixed material constant for most magnetic resonance examinations, and τ is the effective duration of the radio-frequency pulse.

It cannot be assumed, however, that the RF field within the examination subject is homogenous due to the following influencing factors:

- Due to the interaction of the RF field with the human body, a homogeneous $B_1$ distribution cannot be assumed, because of the differing dielectric and electrical properties of the various tissue types. Instead, a strong variation of the $B_1$ amplitudes and phases exists over the entirety of the body volume.
- The finite extent of the antenna elements generating the RF pulses results in the existence of a sufficient $B_1$ homogeneity only within a limited volume. This spatial dependency is, however, only weakly developed in comparison to the aforementioned body inhomogeneity and is for the most part monotonous in its radial dependency. In practice, it therefore represents only a subordinate problem for the pulse calibration, in particular at high field strengths.

For the aforementioned reasons, a radio-frequency pulse with a defined pulse amplitude consequently does not lead to a fixed, defined flip angle over the entire excited volume, but rather to a multitude of generated flip angle values. The flip angle distribution is thereby generally a function of the electrical and dielectric properties of the subject and their geometric distribution. This flip angle variation over the considered volume inevitably leads to an ambiguity in the pulse calibration.

For example, given imaging of the abdomen, regions with strongly reduced $B_1$ amplitude are frequently observed in the body center, in particular at high field strengths. However, regions with strongly increased $B_1$ amplitude also simultaneously exist. If the flip angle required by a measurement sequence is regionally not achieved or is exceeded, this leads to a limited image quality in these regions, for example only a weak signal strength and a low contrast are produced.

In a conventional, known adjustment method, the ambiguity is partially compensated by a complex averaging over portions of the signal-emitting volume. For this purpose, an adjustment of the pulse amplitude ensues, for example with the following MR experiment with the pulse sequence schematically shown in FIG. 1:

A pulse sequence with three RF pulses (with the desired flip angles $\alpha_S$, $2\alpha_S$, $\alpha_S$) is used, with a primary echo signal SE generated by this pulse sequence and a stimulated echo signal STE being evaluated.

During the RF excitation and the signal acquisition, a constant gradient field $G_z$ is simultaneously present in the z-direction (normally the direction of the basic magnetic field $B_0$) of the scanner such that a planar two-dimensional slice is centrally excited in the human body. The acquired signal is the spatially integrated signal from the entire slice volume.

After a Fourier transformation of both echo signals SE, STE, the frequency portions $S_{SE}$ and $S_{STE}$ of the primary echo signal SE and of the stimulated echo signal STE (i.e. the amplitudes of the signals at the central frequency f=0 of the spectrum) are drawn upon for the flip angle calculation. The result is a "median" flip angle α existing in the central slice, which "median" flip angle α was achieved given an applied pulse amplitude, whereby the signal amplitudes $S_{SE}$, $S_{STE}$ multiplied with the $B_1$ phase are inherently complexly averaged:

$$\cos\alpha = \frac{S_{SE} \cdot S_{STE}}{|S_{SE}|^2} \cdot e^{\frac{\Delta T}{T1}} \quad (2)$$

wherein T1 designates the average relaxation time of the entire signal-emitting tissue and ΔT designates the interval between the second RF pulse and the third RF pulse of the exciting pulse sequence.

From this, a new pulse amplitude can be determined that is necessary in order to achieve a desired $B_1$ field. The pulse amplitude so determined then can be verified by a new measurement and, if necessary, be adapted again. This is in particular necessary since, due to the complex averaging in which the spatially-dependent magnetization contributing to the respective echo is complex (thus added up according to magnitude and phase, the correlation between the pulse amplitude and the calculated flip angle will no longer be linear, but rather will saturate at high pulse amplitudes and possibly even lose its monotonous characteristic.

In addition to the cited non-linearity, one disadvantage of this method is the fact that the optimization of the pulse amplitude is based on a flip angle that is complexly averaged over the entire volume. If the area relevant for the imaging then lies in regions with relatively high or low $B_1$ amplitude, the nominal flip angle required by the sequence does not coincide with the actual flip angle, which leads to limitations in the image quality.

As an alternative, two-dimensional, spatially-resolved methods also exist for $B_1$ magnitude and phase determination in the framework of an adjustment. A spatially-specific pulse amplitude calibration can therewith ensue. The monotonous or linear correlation between the pulse amplitude and the measured B1 field is then reestablished for sufficiently small regions. The regions taken into account for the pulse calibration then correspond to, for example, the considered regions in the framework of the clinical imaging.

However, one disadvantage of this method is the long (in comparison to the previously described integrative method) measurement time that is dependent the necessary sequence of N phase coding steps, N designating the matrix size in the phase coding direction. A further disadvantage is in the higher sensitivity to movements of the examination subject (i.e. of the human body) during the measurement time.

SUMMARY OF THE INVENTION

An object of the present invention is to achieve an alternative to the aforementioned prior art that enables an optimally fast and precise adjustment of the field strength of radio-frequency pulses for MR measurements.

This object is achieved in accordance with the invention by a method wherein a test sample volume slice within the examination subject located in a measurement volume of the magnetic resonance measurement system is initially excited by emission of radio-frequency pulses with a defined pulse amplitude from the appertaining radio-frequency antenna. Along a spatial direction of an extent of the test volume slice, one-dimensional, spatially resolved characteristic values are determined which respectively represent the local field strength of the $B_1$ field in strips of the test volume slice running perpendicular to the spatial direction. This means that the characteristic values are, in a defined manner, a measure for the respective $B_1$ field that is present in a rod-shaped sub-volume of the test volume slice, the rod-shaped sub-volumes running perpendicular to the spatial direction and being spatially localized by their position coordinate along the an axis representing the spatial direction.

An average value of the thus-determined characteristic values is then formed at least over a specific segment along the extent direction of the test volume slice. Finally, a pulse amplitude of the radio-frequency pulses is determined on the bases of the average value, this pulse amplitude is thus being adapted to the magnetic resonance measurement to be implemented, at least in a specific volume region of the examination subject.

In the inventive method a spatially-selective pulse amplitude calibration is advantageously enabled by the one-dimensional spatial resolution. By the reduction of the inherent averaging to narrow, strip-shaped volumes perpendicular to an axis in the test volume slice along one extent of the slice, the disadvantageous effects (such as the non-linearity of the correlation between pulse amplitude and determined flip angle as well as the incorrect flip angle determination for the considered body region) described above, and based on the complex addition of the magnetizations varying in magnitude and phase, are reduced or even entirely avoided. Moreover, in comparison to a two dimensional, spatially resolved method, the measurement is possible in 1/N the measurement time of such a two-dimensional, spatially-resolved method.

A magnetic resonance measurement system suitable for implementation of the method inventively has an adjustment device for adjustment of the field strength of radio-frequency pulses that are emitted by a radio-frequency antenna of the magnetic resonance measurement system given a magnetic resonance measurement, as well as the following components:

a characteristic value determination unit that allows emission of radio-frequency pulses with a defined pulse amplitude by the appertaining radio-frequency antenna in order to excite a test volume slice, and such that it determines one-dimensional, spatially-resolved characteristic values along an extent direction of the test volume slice, which characteristic values respectively represent a local field strength of the $B_1$ field in strips of the test volume slice running perpendicular to the extent direction;

an average value formation unit that forms at least one average value of the determined characteristic values over a specific segment along the extent direction of the test volume slice ;

an amplitude determination unit that determines a pulse amplitude of the radio-frequency pulses, which pulse amplitude is adapted to the magnetic resonance measurement on the basis of the average value.

In principle any measurement values that represent the $B_1$ field in the appertaining rod-shaped sub-volumes, i.e. at the appertaining location with regard to the extent direction, can be used as characteristic values. In a preferred exemplary embodiment a median flip angle in a strip of the test volume slice running perpendicularly to the spatial extent direction is determined as a characteristic value at a location along the extent direction, this median flip angle having been induced by the excitation in the appertaining volume strip. This means that here (as in the initial described method) the achieved flip angle is again averaged in a complex manner, such that regions overlap destructively due to phase variations. Since only one strip of the test volume slice is acquired (which is different than in the case described above), however, fewer phase variations occur than when such a complex averaging ensues over the entire two-dimensional volume of the test volume slice.

The averaging over the individual characteristic values within the considered segment can in principle ensue in a very simple manner. This means that, for example, all characteristic values are weighted equally. Alternatively, in the averaging the characteristic values can be weighted with a weighting factor. This weighting factor is preferably spatially dependent.

In another preferred exemplary embodiment, the weighting factor is selected dependent on a measurement value amplitude that was measured at the appertaining location given the spatially-resolved determination of the characteristic values. For example, the magnitude of the amplitude can be directly selected. Any arbitrary function of the measurement value amplitude (for example a quadratic function or a root function of the measurement value amplitude), however, can be used in principle.

Insofar as the one-dimensional, spatially-resolved measurement of the characteristic values is implemented with a spin echo measurement sequence, the weighting factor is selected dependent on an echo amplitude measured at the appertaining location. For example, the primary spin echo amplitude can be used in the case of classical spin echo methods, gradient echo methods, turbo spin echo methods, EPI methods or the like.

An advantage of a weighting factor dependent on a measurement value amplitude (in particular an echo amplitude) is in that a self-weighting is implemented in which regions with a high signal are strongly weighted and regions with less signal are correspondingly weighted less. In this manner regions that are dominated by noise are only marginally taken into account in the averaging.

However, if a case exists in which regions with comparably low signal are of particular clinical interest, these are correspondingly taken into account with only weak weighting in the averaging. If applicable, depending on the case a different function dependency of the measurement value amplitude (in particular of the spin echo amplitude) can therefore be used such as, for example, a quadratic function or root function. In this manner it can be determined in advance to what extent regions with weak signal are taken into account. The rules of how the weighting factors are established can thereby also be established dependent on the type of the measurement and the region to be examined.

Preferably, only characteristic values of the locations at which a measurement value amplitude measured in the spatially-resolved determination of the characteristic values at the appertaining location (which measurement value amplitude lies above a predeterminable threshold) are taken into account in the averaging. This particularly makes sense when an equilibration ensues. Such a weighting corresponds to an equilibration with a weighting factor of 1 for all locations at which the measurement value amplitude lies above the threshold and 0 for all locations at which the measurement value amplitude lies below the predetermined threshold. Such a threshold can be established, for example, as a determined (specific) multiple of the noise level.

The one-dimensional, spatially-resolved measurement of the characteristic values in principle can ensue along an arbitrary extent direction of the test volume slice. This extent direction, however, preferably is established such that it runs within the excited test volume slice in the direction of the greater body expansion of an examination subject to be examined.

The one-dimensional, spatially-resolved measurement of the characteristic values should ensue along an extent direction of the test volume slice in which the greatest variation of the field strength amplitude and phase of the $B_1$ field is to be expected on the basis of prior information. In most cases, this direction coincides with the direction of the greater body expansion of the examination subject to be examined. The prior information for establishment of the extent direction along which one-dimensional, spatially-resolved measurement is made can originate from prior examinations. Alternatively, experiential values can be established dependent on the transmission antenna that is used and the body region under consideration.

After the determination of the extent direction, it must be established over which segment along the extent direction the characteristic value average is formed. This advantageously ensues under consideration of the examination volume to be examined in the magnetic resonance measurement to be implemented. This means that the limits between which the measured characteristic values along the extent direction are used for formation of the average value can be determined, for example, from the planned measurement by projection of the planned slice volume on the extent axis or via a projection of the planned slice on a plane in the test volume slice. Reasonable limit values are thereby taken into account so that the position and the absolute width of the segment are selected such that the entire "averaging segment" (i.e. the segment over which an average is formed) is securely located within the region to be examined. Various possibilities for establishment of the averaging segment are explained below.

In principle the most varied methods can be used for the one-dimensional, spatially-resolved measurement of the characteristic values. In a preferred method, the excitation of the test volume slice ensues with a double echo radio-frequency pulse sequence with a first excitation pulse and at least two following refocusing pulses for generation of a first echo signal (known as the primary spin echo) and a subsequent second echo signal (known as the stimulated echo). The characteristic value, advantageously a flip angle, is then determined on the basis of the first and second echo signals measured at the respective locations along the test volume. This means that a similar method to the adjustment method also described above is used, now the flip angle along the extent direction is determined with spatial resolution.

The excitation of the test volume slice thereby advantageously ensues by emission of an at least weakly slice-selective first radio-frequency excitation pulse during the activation of a magnetic field gradient in a first spatial direction. The one-dimensional, spatially-resolved determination of the characteristic values then ensues with a frequency-coded readout method of the magnetic resonance signals (induced by the excitation) with a readout gradient situated perpendicular to the first spatial direction. A phase coding thus is advantageously omitted. The method is thereby significantly accelerated relative to two-dimensional, spatially-resolved methods.

As described above, there are problems when moving anatomies lie in the region considered for the $B_1$ field determination. Examples for this are heart movement or tissue displaced due to breathing. In these cases the signal strengths of the echoes are reduced, due to movement, by signal dephasing, i.e. by intra-voxel phase dispersion. A moment-compensated pulse sequence is therefore advantageously used for excitation of the test volume slice. This means that gradient pulses appropriately corresponding to the radio-frequency pulse sequence which is emitted via the radio-frequency antenna are emitted such that all gradients are simultaneously movement-compensated up to a specific order, for example up to the first or second order. The independency of the echo signals (depending on the order) from the speed or an acceleration of the moving organs is thereby achieved.

In a preferred exemplary embodiment, all components of the magnetic resonance measurement system are realized in the form of software modules on a programmable processor of a control device of the magnetic resonance measurement system. For example, the adjustment device can be a software module that embodies the characteristic value determination unit, the averaging unit and the amplitude determination unit as sub-routines, or software sub-modules. In principle it is also possible to realize the individual software modules distributed among a number of processors or to additionally utilize already-existing software modules which are used for other control purposes. Such a realization of the invention according to software has the advantage that already-existing magnetic resonance measurement systems can be upgraded (retrofitted) in a simple manner.

DESCRIPTION OF THE DRAWINGS

FIG. 1 shows a pulse sequence for measurement of the average flip angle in a slice according to the prior art.

FIG. 2 shows an exemplary embodiment of a pulse sequence for one-dimensional, spatially-resolved measurement of the flip angle according to the invention.

FIG. 3 shows a pulse sequence as in FIG. 2, but with movement compensation.

DESCRIPTION OF THE PREFERRED EMBODIMENTS

Figure 4B:
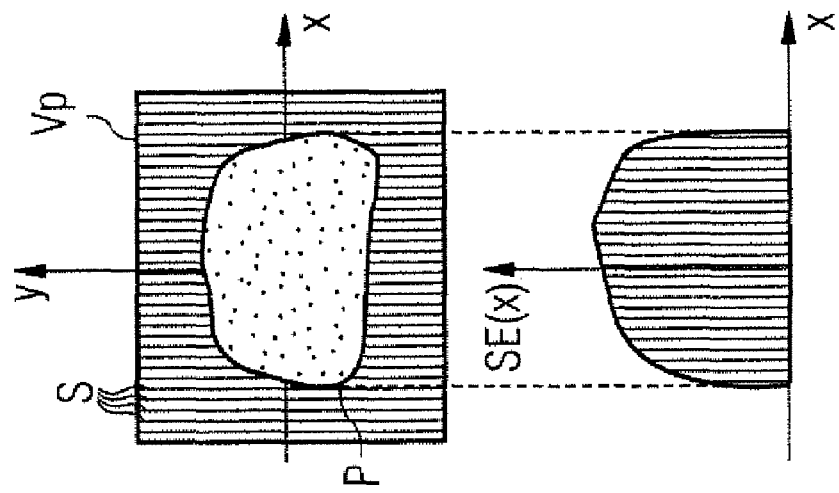
FIG. 4B schematically shows a side view of the test volume slice of FIG. 4A.

In the pulse sequence scheme shown in FIG. 1, the pulses emitted by the radio-frequency transmission antenna and the gradients appropriately switched in temporal dependence on the radio-frequency pulses are shown in a typical manner on parallel time axes (i.e. over time t).

The scheme shown in FIG. 1 is a typical scheme already explained above in order to determine an average flip angle within a slice volume according to the conventional manner. The radio-frequency pulses emitted by the radio-frequency transmission antenna are plotted on the uppermost axis designated with RF (radio-frequency). The gradient $G_z$ shown under this is known as the slice-selection gradient, which is typically applied in the z-direction (i.e. in the direction of the basic magnetic field) and allows a selection of a specific slice or of a determined sub-volume upon excitation. The time windows in which a signal is measured with an ADC (analog-digital converter) are shown on the lowermost axis in a typical manner. The respective signal is in turn shown above on the radio-frequency axis RF. As explained above, this is an excitation pulse sequence in which a first radio-frequency pulse that should induce a flip angle of $\alpha_S$ is initially emitted given a permanently-activated, stationary slice-selection gradient $G_z$. After a specific time a second refocusing pulse is then emitted with an intensity which would induce a flip angle of $2 \cdot \alpha_S$. A spin echo can thereupon be read out at the ADC within a correspondingly placed readout time window. After a time $\Delta T$ a second, shorter refocusing pulse which would achieve an excitation of a desired flip angle of $\alpha_S$ then ensues at an interval from the first refocusing pulse. A stimulated echo signal STE is subsequently read out at the ADC within a further time window. The processing of the signals to determine the actual achieved average flip angle $\alpha$ is explained above in connection with equation 2.

In comparison to this, for example, the pulse sequence PS shown in FIG. 2 can be used for an inventive one-dimensional, spatially-resolved measurement in a test volume slice $V_P$.

A gradient in the x-direction $G_x$ is additionally plotted in the sequence scheme according to FIG. 2. This known as the readout or frequency encoding gradient which is applied during a magnetic resonance signal acquisition in order to readout frequency-coded signals in a specific slice (here in the x-direction perpendicular to the z-direction). The precise progression of the frequency coding for one-dimensional, spatially-resolved measurement within a slice as well as the representation in such a sequence schematic are known to those skilled in the art and therefore need not be explained in detail.

Moreover, an axis for the y-gradient $G_y$ is shown, known as the phase coding gradient. A phase coding ensues with the aid of this gradient when a two-dimensional spatial resolution is desired. For this purpose, the shown complete pulse sequence must be run through multiple times, whereby a very specific phase coding gradient is respectively applied. In the inventive pulse schematic such a phase coding is deliberately omitted in order to correspondingly accelerate the measurement. The $G_y$ axis is represented only as a blank (empty) axis. As mentioned previously, only a one-dimensional readout ensues in the x-direction with the frequency coding gradient $G_x$.

In this pulse sequence the radio-frequency pulse frequency RFS also includes an excitation pulse RFA and two refocusing pulses $RFR_1$, $RFR_2$ that are set at a corresponding temporal interval relative to one another. The excitation pulse RFA again has the strength in order to achieve a desired flip angle $\alpha_S$. It is selected by its form such that it is at least weakly slice-selective. A first slice-selection gradient pulse $G_{z1}$ is simultaneously applied, as is shown on the axis $G_z$. This slice-selection gradient pulse $G_{z1}$ immediately follows a shorter negative slice gradient pulse that is required in order to again rest the unwanted dephasing of the magnetization generated by the slice gradient pulse $G_{z1}$. A first gradient pulse $G_{x1}$ subsequently follows on the $G_x$ axis, which first gradient pulse $G_{x1}$ serves in order to dephase spins in the direction of the read gradient $G_x$ in advance and therewith to achieve a refocusing of the echoes during the readout time given a later application of the actual frequency coding pulses $G_{x2}$, $G_{x3}$.

The first refocusing pulse $RFR_1$ of the intensity $2 \cdot \alpha_S$ is subsequently set, while at the same time a slice gradient pulse $G_{z2}$ is switched such that this refocusing pulse also acts in the same slice as the excitation pulse RFA. However, it is thereby not necessary to use a slice-selective refocusing pulse.

After a specific temporal interval, the first readout gradient pulse $G_{x2}$ is then set and at the same time the spin echo sequence SE is read out at the ADC in the first readout window ADC$_1$. After expiration of a specific time span ΔT, a further refocusing pulse RFR$_2$ of the intensity α$_S$ is set, so again a slice gradient pulse G$_{z3}$ is set at the same time. After a further time expiration a readout gradient G$_{x3}$ is newly set and the stimulated echo signal STE is measured at the ADC within a second readout window ADC$_2$.

The measured spin echo sequences and stimulated echo signals are then Fourier-transformed. After the Fourier transformation of both echoes, the signal distributions of the primary echoes S$_{SE}$(x) as well as of the stimulated echoes S$_{STE}$(x) in the frequency domain respectively represent spatial projections within the excited slice on the readout axis x. The complex addition of the magnetizations thereby persist over all y positions since no phase coding gradient is used. However, the problems occurring due to the magnitude and phase variations of the B$_1$ field in the x-direction are corrected relative to the method explained in connection with FIG. 1. This consequently enables a spatially-dependent flip angle calculation α(x) for each position x along the x-axis according to the equation:

$$\cos(\alpha(x)) = \frac{S_{SE}(x) \cdot S_{STE}(x)}{|S_{SE}(x)|^2} \cdot e^{\frac{\Delta T}{T1}} \quad (3)$$

This equation essentially corresponds to equation (2), with the exception that here the echo signals exist spatially-resolved in the x-direction and accordingly the flip angle α(x) is also measured with spatial resolution. In this equation T1 also designates the average relaxation time of the entire signal-emitting tissue and ΔT designates the temporal separation between the first refocusing pulse RFR$_1$ and the second refocusing pulse RFR$_2$.

At this point it should be noted that the equation (3) applies for the radio-frequency pulse sequence (here exemplarity selected) with the desired flip angles (α$_S$, 2α$_S$, α$_S$). However, the method can also be applied for every other flip angle combination and other desired flip angles. The correlation between the echo signals and the respective flip angle can then be simply derived corresponding to the general dependencies (known in the literature) of the primary and stimulated echoes of the respective flip angle combination.

As explained above, there are problems when a moving anatomy (for example a moving heart or tissue which displaces due to the breathing) exists in the considered region (i.e. in the test volume slice). This means that during the imaging it can occur that a voxel excited by the excitation pulse RFA displaces until it ultimately generates a spin echo sequence SE or a stimulated echo signal STE. It can therefore lead to a dephasing in the voxel, i.e. the signal amplitude of the echo is attenuated. In the extreme case this can lead to this voxel no longer emitting a signal at all. A movement-compensated pulse sequence PS$_M$ is therefore advantageously used for excitation of the test volume slice. It is thereby attempted to reset the phase to zero at the point in time of the echo. In FIG. 3 a suitable pulse sequence PS$_M$ is shown which is suitable for a compensation of up to the first order, i.e. for compensation of constant speeds. In order to achieve a compensation of the second order, given which accelerations are also compensated, a significantly more complex pulse sequence is necessary. However, in principle this is also possible.

Given the pulse scheme PS$_M$ shown in FIG. 3, both the primary spin echo SE and the stimulated echo STE can be compensated in the x-direction. Movements in the z-direction are likewise compensated. As a comparison of FIGS. 3 and 2 shows, the movement-compensated pulse sequence PS$_m$ with regard to the radio-frequency pulse sequence RFS does not differ from the simple pulse sequence PS as it is shown in FIG. 2. Here as well there are again the dephasing readout gradients G$_{x1}$ as well as the two readout gradients G$_{x2}$, G$_{x3}$ and the slice-selection gradients G$_{z1}$, G$_{z2}$, G$_{z3}$ in the z-direction. However, further gradient pulses are set subsequent to or preceding the respective gradients in a suitable manner in order to achieve the desired movement compensation of the first order. The spin echo sequence SE and the stimulated echo signal STE are again likewise set at the ADC within the readout windows ADC$_1$, ADC$_2$ at the matching points. The precise methods to movement-compensate a pulse sequence are known to those skilled in the art and do not need to be explained further here.

By this flow compensation it is ensured that the quality of the signal amplitudes is not impaired by dephasing due to moving anatomies. Instabilities in the flip angle determination are thus avoided. The signal portion of the moving organs contribute to the total result in an unreduced manner with the corresponding weighting.

Figure 4A:
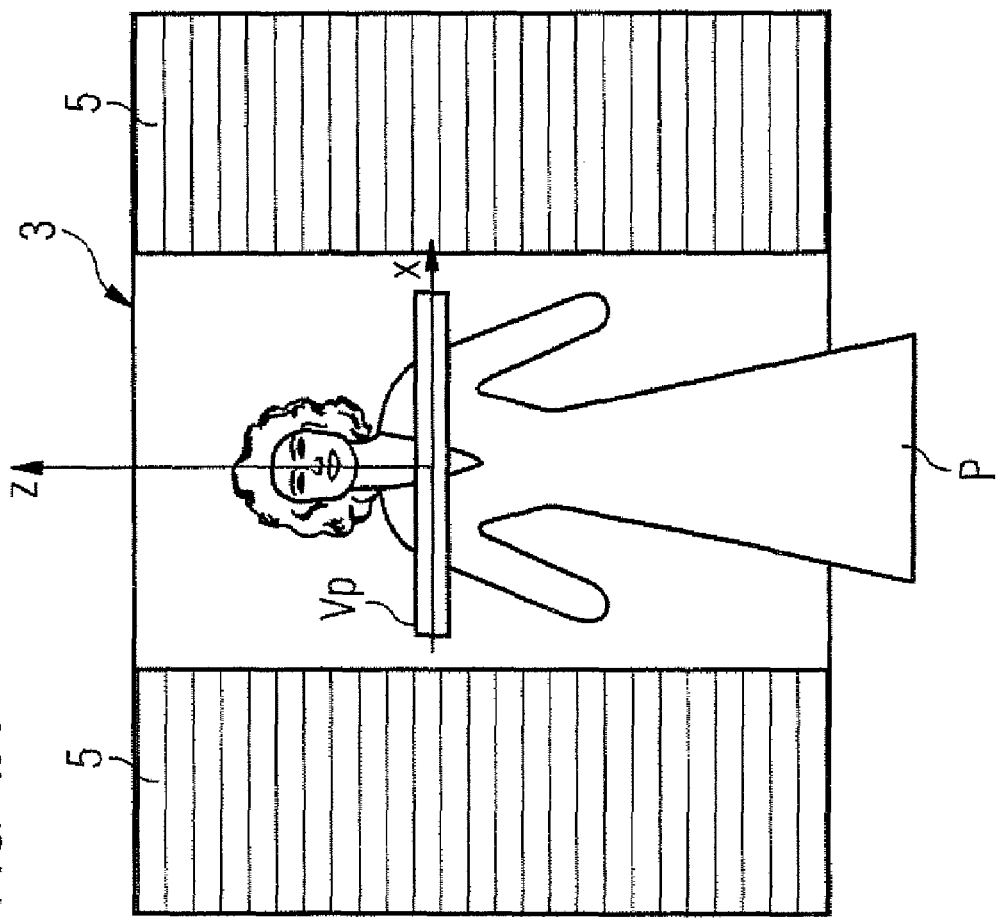
FIG. 4A schematically shows the position of a test volume slice for implementation of the inventive method in the plan view of a patient.

The selection of the axes advantageously ensues as shown in FIGS. 4a and 4b, i.e. a test volume slice V$_P$ is advantageously selected perpendicular to the typical z-direction of the tomographic scanner 3 (in the longitudinal axis parallel to the typically annular magnet 5 surrounding the patient, which magnet 5 generates the constant basic magnetic field B$_0$). The axis of the spatial resolution is advantageously selected such that the remaining complex averaging over the flip angle α along the direction with the smaller body expansion lies within the excited test volume slice V$_P$. This is the y-axis in the example shown in FIG. 4A and FIG. 4B. This means that the axis along which the spatially-resolved measurement ensues (in the present example the x-axis) should lie along the direction with the larger body expansion. FIG. 4A shows the test volume slice V$_P$ from above through the chest [ribcage] of the patient. FIG. 4B shows a section view through this test volume slice V$_P$, whereby the entire test volume is shown in the upper image. Shown here as well are the individual strip-shaped volumes S perpendicular to the x-axis along which a spatially-resolved measurement is made, meaning that the complex spin echo sequence SE averaged over the entire body cross-section at the appertaining location is respectively measured at each position along the x-axis, which spin echo sequence SE is present at the appertaining location in the respective strip-shaped test volume S. The stimulated echo signal STE is also measured in the same manner and then the complexly-determined flip angle is then determined at the location within the strip S corresponding to equation (3). As can be seen from FIG. 4B, no signal is acquired from regions that lie outside of the body of the patient P since here no excitable tissue exists.

Alternatively, the axes x and y are also placed such that the spatial resolution ensues along the direction in which the greatest variation of the B$_1$ amplitude and phase is to be expected using the prior examinations and experiential values (dependent on the transmitter antenna used and the body region under consideration). However, this normally coincides with the shown selection of the axes.

In a further step, starting from the flip angle distribution α(x) along the x-direction obtained according to equation (3) an average flip angle α$_M$ is then determined by weighted averaging over a limited range from x$_1$ to x$_2$:

$$\alpha_M = \frac{\sum_{x=x_1}^{x=x_2} \alpha(x)w(x)}{\sum_{x=x_1}^{x=x_2} w(x)} \quad (4)$$

wherein w(x) thereby represents a weighting factor.

Various variables can be used as a weighting factor w(x), for example the primary spin echo amplitude:

$$w(x)=|S_{SE}(x)| \quad (5a)$$

or the square of the primary spin echo amplitude:

$$w(x)=|S_{SE}(x)|^2 \quad (5b)$$

or the root of the primary spin echo amplitude:

$$w(x)=\sqrt{|S_{SE}(x)|} \quad (5c)$$

or the root of the quadratic sum of the spin echo amplitude and the amplitude of the stimulated echo:

$$w(x)=\sqrt{|S_{SE}(x)|^2+|S_{STE}(x)|^2} \quad (5d)$$

or general, arbitrary functions f of the echo amplitudes:

$$w(x)=f(|S_{SE}(x)|,|S_{STE}(x)|). \quad (5e)$$

With such a weighting it is ensured that regions in which a strong noise exists are not taken so strongly into account in the averaging. Alternatively (for example as described above) an equilibration is possible, whereby only values that lie above a determined threshold are used for the averaging.

A significant point in the practical application of the method is the establishment of the limits $x_1$, $x_2$ within which the averaging ensues. This means that it is to be established which volume is actually to be used afterwards for determination of the average flip angle and for the further adjustment. In each case the selection of the segment defined by the limits $X_1$, $x_2$ along the extent direction of the test volume slice $V_P$ (via which the average value $\alpha_M$ of the determined characteristic values $\alpha(x)$ is formed) should be determined under consideration of the examination volume UV which should be examined in the subsequent measurement.

Figure 5A:
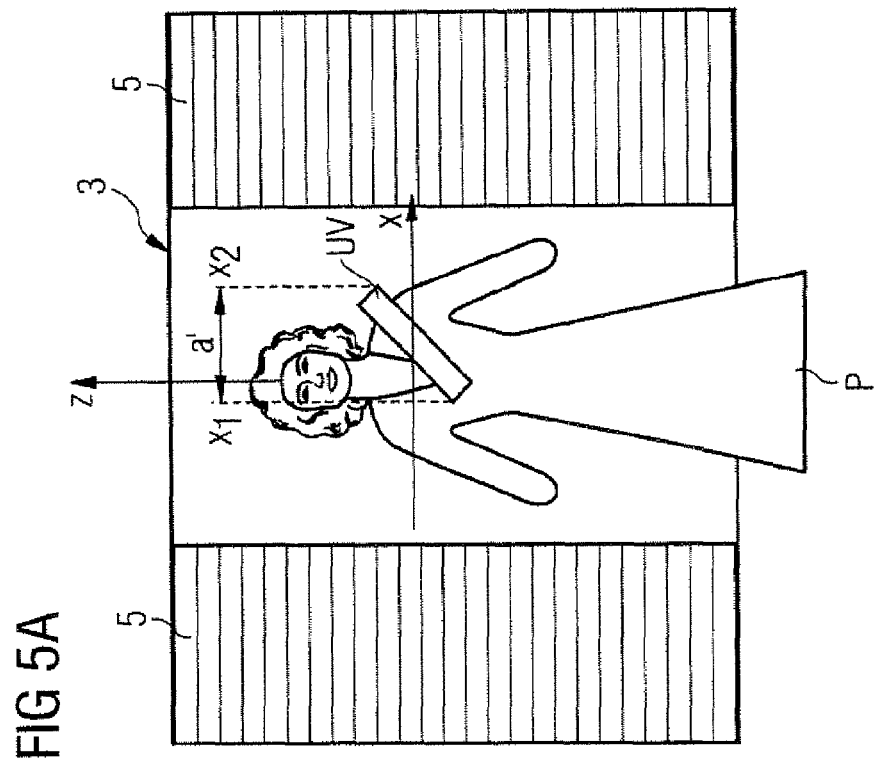
FIG. 5A schematically shows an examination volume in the plan view of a patient.

FIG. 5A again shows as an example the patient P (already shown in FIG. 4A) in a tomographic scanner 3 as well as a typical position of an examination volume (typically a slice stack) that has a precisely defined position within the patient. The example shown in FIG. 5A is a slice stack UV suitable for a heart examination.

Figure 5B:
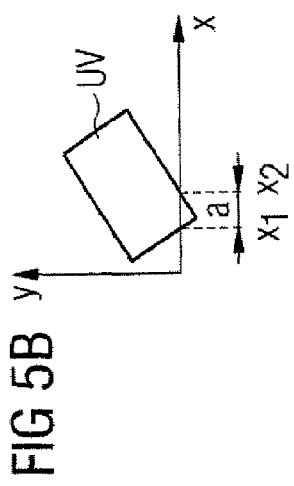
FIG. 5B schematically shows selection of an averaging segment for the inventive method according to a first exemplary embodiment.
Figure 5C:
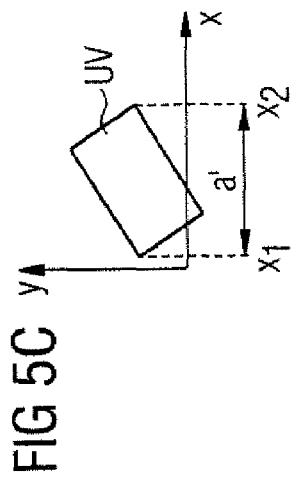
FIG. 5C schematically shows selection of an averaging segment for the inventive method according to a second exemplary embodiment.
Figure 5D:
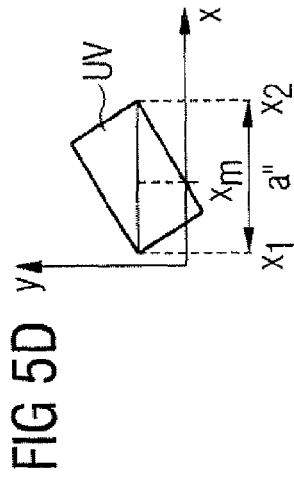
FIG. 5D schematically shows selection of an averaging segment for the inventive method according to a third exemplary embodiment.

FIGS. 5B through 5D show various variants of how the limits $x_1$ and $x_2$ for the averaging according to equation (4) can be determined with the aid of the planned examination volume UV.

According to FIG. 5B, the examination volume UV is projected onto the x-axis running through the isocenter of the tomograph 3 and the limit values $x_1$ and $x_2$ thereby resulting are taken into account in order to obtain the segment a along which the averaging ensues.

In the method shown in FIG. 5C, a projection of the planned slice volume ensues on the x/y plane and the resulting minimal x-position of the slice stack UV is then used as an $x_1$ value and the maximum x-position of the slice stack UV is used as an $x_2$ value in order to determine the averaging segment a'. This variant is also shown from above in FIG. 5A.

According to the method according to FIG. 5D, a pre-allocation of the averaging segment a" ensues in a simple manner with a predefined interval $x_2-x_1$ whereby an average value $x_M=0.5\cdot(x_2-x_1)$ is derived from the planned slice volume UV.

However, in all methods reasonable limit values of the relative separation of the points $x_1$, $x_2$ or, respectively, their absolute positions should be required in order to guarantee the convergence of the adjustment method. This means that the measurement volumes should be large enough so that the measurement of the characteristic values $\alpha(x)$ is good enough in order to ensure a reproducibility of successive measurements during the adjustment method. Otherwise an adjustment is not possible since the dependency of the flip angle on the transmission amplitude can no longer be detected.

As a further alternative a prior determination of the segments or, respectively, of the points $x_1$ and $x_2$ is therefore also possible with typical values that have turned out to be reasonable in patients. For example, previous examinations show that a minimum of the $B_1$ field typically exists in the abdomen, in the region of the spinal column and in the region of the sternum, and thus a limitation to a central body region with a predefined width is advantageous for the abdomen and spinal column imaging in order to achieve a $B_1$ amplitude that is suitable for a good image quality. Given use of a head acquisition coil, the segment should be limited to, for example, the central 10 cm since here a $B_1$ superelevation exists given high $B_0$ field strengths.

The decision of which method is drawn upon to establish the averaging segment or, respectively, which maximum and minimum values $x_1$, $x_2$ are respectively applied is made in a further preferred exemplary embodiment using the utilized reception coil. The reception coils are frequently dedicated to specific body regions (optimized with regard to their geometry and their acquisition properties) and are also generally used only for specific regions. The usage of a coil is thus for the most part characteristic for the examined body region. Since the $B_1$ inhomogeneities with regard to amplitude and phase are likewise frequently characteristic for specific body regions (for example head or abdomen), a corresponding, optimally adapted method can be used for establishment of the averaging segment.

Figure 6:
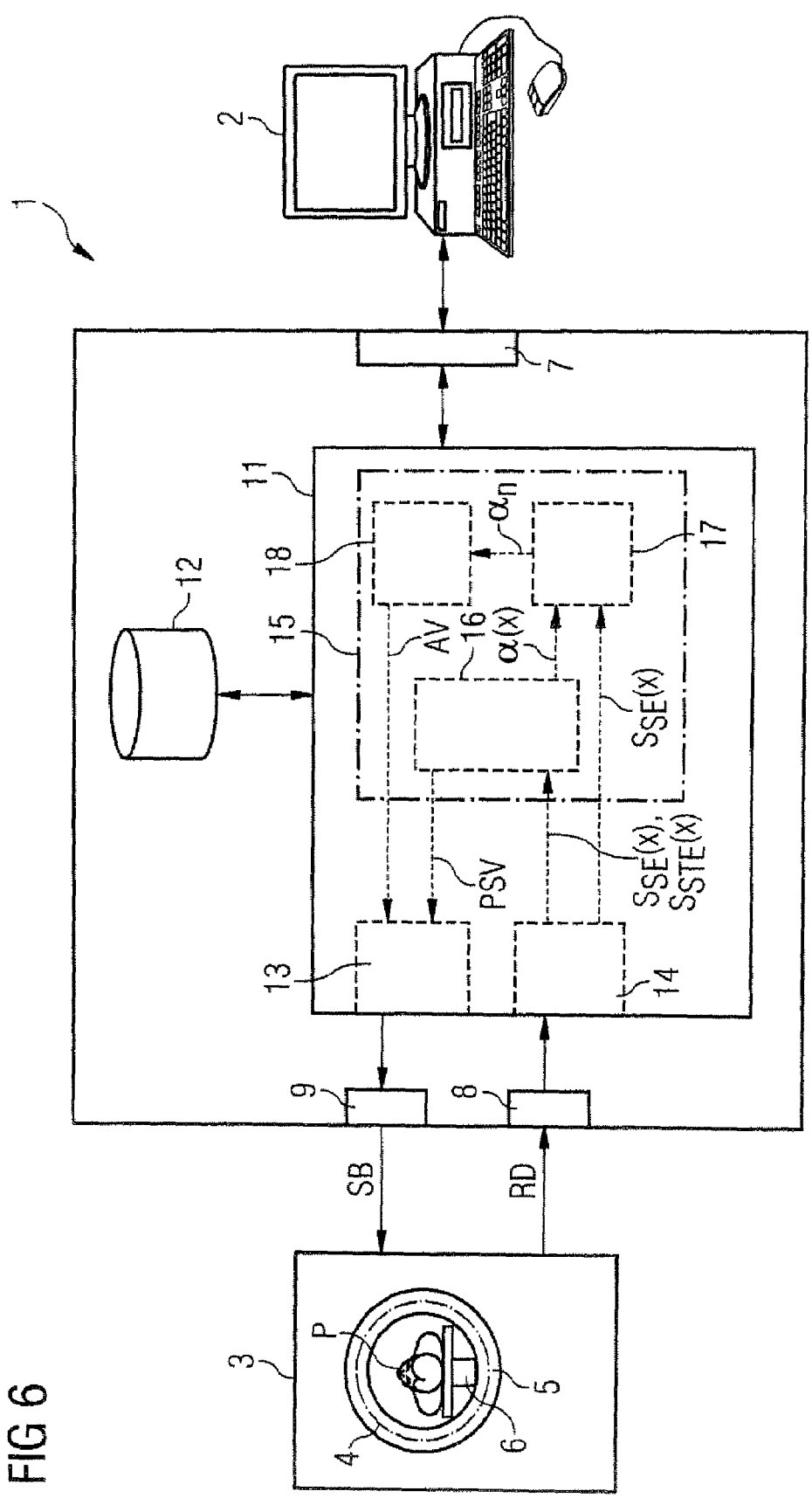
FIG. 6 schematically illustrates the basic components of an inventive magnetic resonance measurement system.

FIG. 6 shows a basic principle block diagram for an exemplary embodiment of a magnetic resonance measurement device 1 with which the inventive method can be implemented.

The core of this magnetic resonance measurement device 1 is a tomographic scanner 3 (also called a scanner 3) in which a patient P is positioned on a bed 6 in an annular basic field magnet 5. A radio-frequency antenna 4 for emission of the MR radio-frequency pulses is located within the basic field magnet 5. This is a commercially available tomographic scanner 3 which must fulfill no particular additional structural requirements for the inventive method. The tomographic scanner 3 is activated by a system controller 10 which is shown separately here. A terminal 2 (or operator console) via which an operator operates the system controller 10 and therewith the tomographic scanner 2 is connected to the system controller 10 via a terminal interface 7. The system controller 10 is connected with the tomographic scanner 3 via a control interface 9 and an image acquisition interface 8. The corresponding control commands SB are output via the control interface 9 to the tomographic scanner 3 so that the desired pulse sequences (i.e. the radio-frequency pulses and the gradient pulses) are emitted. The raw data RD are acquired via the image data acquisition interface 8, i.e. the acquired signals are read out via the ADCs.

Both the system controller 10 and the terminal 4 can also be integral components of the tomographic scanner 3. The system controller 10 moreover has a bulk storage 12 in which, for example, generated image data can be stored, measurement protocols can be saved, etc.

The entire magnetic resonance measurement system 1 moreover also exhibits all further typical components or, respectively, features such as, for example, interfaces for connection to a communication network, for example an image information system (PACS, Picture Archiving and Communication System). However, for reasons of better clarity these components are not shown in FIG. 6.

A central point in the system controller 10 is a processor 11 in which various control components are realized in the form of software. At this point it is noted that such a system controller 10 can naturally also exhibit a plurality of processors networked with one another, on which processors the various control components are realized.

Such a component is the scanner activation unit 13, with which the user can communicate via the terminal 2. This scanner activation unit 13 activates the tomograph 3 via the control interface 9 and thus provides for the emission of the desired radio-frequency pulse sequences via the antenna 4, and furthermore for the switching of the gradients in a suitable manner in order to implement the desired measurements. This typically ensues according to established acquisition protocols for specific measurements.

The measurement data arriving over the image acquisition interface 8 are directed to a further component realized on the processor 11, an image data processing unit 14 which correspondingly processes the acquired raw data. The image data processing unit 14 provides for a Fourier transformation of the raw data, generates the necessary measurement values and also provides for a reconstruction of images.

The inventive magnetic resonance measurement system 1 has an adjustment device 15 as a further component of the system controller 10, likewise realized in the form of software on the processing 11. This adjustment device 15 includes as sub-components (for example in the form of software modules) a characteristic value determination unit 16, an averaging unit 17 and an amplitude termination unit 18.

The characteristic value determination unit 16 gives a pulse sequence specification PSV to the scanner activation unit 13 and thus provides for an emission of the pulse sequences for one-dimensional, spatially-resolved measurement of a flip angle $\alpha$ within a test volume slice $V_P$ excited by the corresponding pulse sequence. For example, via the pulse sequence specification PSV it can be initiated that a measurement ensues with the pulse sequence $PS_m$ shown in FIG. 3. The measured raw data are then further processed in the image data processing unit 14 and the spin echo sequence and the stimulated echo signal or the signal amplitudes $S_{SE}(x)$, $S_{STE}(x)$ of these signals are determined and relayed to the characteristic value determination unit 16. The determination unit 16 then calculates (for example according to the equation (3)) a spatially-dependent flip angle $\alpha(x)$ along the x-axis and delivers the values to an averaging unit 17.

From this the averaging unit 17 calculates an average flip angle $\alpha_m$ according to equation (4). In the exemplary embodiment of the image data processing unit 14 shown in FIG. 6, the averaging unit 17 likewise acquires the required signal amplitudes of the primary spin echo $S_{SE}$ as a weighting factor. The limit values $x_1$, $x_2$ mentioned above in connection with equation (4) that are necessary for establishment of the segment (over which averaging is conducted along the x-axis) can, for example, already be stored in the storage 12 for specific measurements or be predetermined by the user via the terminal 2.

The flip angle average value $\alpha_m$, calculated by the averaging unit 17 is then forwarded to an amplitude determination unit 18 which determines (on the basis of the average flip angle $\alpha_m$) an optimal amplitude for the further emission of the radio-frequency pulses and sends a corresponding amplitude specification AV to the scanner activator 13, which takes this amplitude specification AV into account in the further measurements. The adjustment device 15 can implement this method until a sufficient convergence is achieved, i.e. until it is established in the amplitude determination unit that the measured average flip angle $\alpha_m$ corresponds to an average desired flip angle within specific limits. The adjustment method is then ended and a measurement can be implemented in a typical manner.

The method described in detail in the preceding as well as the shown magnetic resonance measurement device are only exemplary embodiments that can be modified by those skilled in the art without departing from the scope of the invention. In particular other forms of excitation pulses or sequences of excitation pulses can be used instead of the excitation pulse described herein.

The inventive adjustment method, moreover, can be combined with the adjustment method described above in which a measurement ensues that is not spatially-resolved or a two-dimensional, spatially-resolved measurement of a characteristic value (in particular of a flip angle). In specific cases a two-dimensional, spatially-resolved measurement method is reasonable and it depends less in these cases on the duration of the measurement time. In a preferred embodiment, for example, the measurement method of the adjustment method can therefore be selected (advantageously automatically) dependent on the utilized reception coil. As explained above, both the usage of a specific reception coil, and the $B_1$ inhomogeneities with regard to amplitude and phase are frequently characteristic for the examined body region. An optimal adjustment method suitable for the specific case therefore can be automatically established in a simple manner based on the selected reception coil.

The invention has been explained based on an application in a medically utilized magnetic resonance measurement device, but it is not limited to such applications, and can also be used in scientific and/or industrial applications. The method can in particular be used not only for simple, conventional magnetic resonance measurements but rather also for magnetic resonance spectroscopy measurements.

We claim:

1. A method for adjusting the field strength of radio-frequency pulses emitted by a radio-frequency antenna of a magnetic resonance system, comprising the steps of:

initially exciting a test volume slice by emitting radio-frequency pulses with a defined pulse amplitude from said radio-frequency antenna, and determining one-dimensional, spatially-resolved characteristic values along an extent direction of the test volume slice, said one-dimensional, spatially resolved characteristic values respectively representing a local field strength of the radiated radio-frequency field in strips of the test volume slice proceeding perpendicularly to said extent direction;

forming an arithmethic mean value of said characteristic values at least over one predetermined segment along said extent direction; and from said arithmethic mean value, determining and setting a pulse amplitude of radio-frequency pulses to be emitted in a diagnostic magnetic resonance measurement.

2. A method as claimed in claim 1 comprising, as said characteristic values, determining average flip angles respectively induced at locations in each strip of said test volume slice.

3. A method as claimed in claim 1 comprising weighting said characteristic values with a weighting factor when forming said arithmethic mean value.

4. A method as claimed in claim 3 comprising employing a spatially-dependent weighting factor.

5. A method as claimed in claim 4 comprising employing a weighting factor that is dependent on a measurement value amplitude measured at each respective location.

6. A method as claimed in claim 5 comprising determining said one-dimensional, spatially-resolved characteristic values with a spin echo measurement sequence, and employing a weighting factor dependent on an echo amplitude measured at said respective locations.

7. A method as claimed in claim 1 comprising, in forming said arithmethic mean value, using only characteristic values for which a measurement value amplitude, measured at the location of the respective characteristic values, exceeds a predetermined threshold.

8. A method as claimed in claim 1 comprising exciting said test volume slice by emitting a double echo radio-frequency pulse sequence comprising a first excitation pulse and at least two subsequent refocusing pulses, causing generation of a first echo signal and a subsequent second echo signal, and comprising determining said characteristic values respectively from the first and second echo signals at respectively locations along said test volume slice.

9. A method as claimed in claim 1 comprising exciting said test volume slice by emitting a weakly slice-selective first radio-frequency excitation pulse during activation of a magnetic field gradient in a first spatial direction, and determining said one-dimensional, spatially-resolved characteristic values by frequency-coded readout of magnetic resonance signals acquired during activation of a readout gradient applied perpendicularly to said first spatial direction.

10. A method as claimed in claim 1 comprising exciting said test volume slice with a movement-compensated pulse sequence.

11. A method as claimed in claim 1 wherein said test volume slice is a slice in an examination subject having a largest body extent, and comprising determining said one-dimensional, spatially-resolved characteristic values along an extent direction of said test volume slice proceeding in said test volume slice in said direction of said greatest body extent.

12. A method as claimed in claim 1 comprising, prior to exciting said test volume slice, identifying a predetermined extent direction of said test volume slice, at which a largest variation of the field strength amplitude and phase of the emitted radio-frequency field is expected, and determining said one-dimensional spatially-resolved characteristic values along said predetermined extent direction.

13. A method as claimed in claim 1 comprising determining said segment dependent on an examination volume of a subject to be examined in said diagnostic magnetic resonance measurement.

14. A magnetic resonance system comprising:
a magnetic resonance scanner having a radio-frequency antenna; and
a controller that operates said radio-frequency antenna by initially exciting a test volume slice by emitting radio-frequency pulses with a defined pulse amplitude from said radio-frequency antenna, and said controller determining one-dimensional, spatially-resolved characteristic values along an extent direction of the test volume slice, said one-dimensional, spatially resolved characteristic values respectively representing a local field strength of the radiated radio-frequency field in strips of the test volume slice proceeding perpendicularly to said extent direction, and forming an arithmethic mean value of said characteristic values at least over one predetermined segment along said extent direction, and from said arithmethic mean value, determining and setting a pulse amplitude of radio-frequency pulses to be emitted in a diagnostic magnetic resonance measurement.

15. A computer-readable medium encoded with a data structure loadable into a control computer of a magnetic resonance system having a radio-frequency antenna, said data structure causing said control computer to:
initially excite a test volume slice by emitting radio-frequency pulses with a defined pulse amplitude from said radio-frequency antenna, and determine one-dimensional, spatially-resolved characteristic values along an extent direction of the test volume slice, said one-dimensional, spatially resolved characteristic values respectively representing a local field strength of the radiated radio-frequency field in strips of the test volume slice proceeding perpendicularly to said extent direction;
form an arithmethic mean value of said characteristic values at least over one predetermined segment along said extent direction; and
from said arithmethic mean value, determine and set a pulse amplitude of radio-frequency pulses to be emitted in a diagnostic magnetic resonance measurement.

\* \* \* \* \*